(12) United States Patent
Kim (10) Patent No.: US 8,580,669 B2
(45) Date of Patent: Nov. 12, 2013

(54) METHOD FOR FABRICATING SEMICONDUCTOR DEVICE

(75) Inventor: Hyun Jung Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 206 days.

(21) Appl. No.: 12/980,175

(22) Filed: Dec. 28, 2010

(65) Prior Publication Data

US 2011/0169174 A1    Jul. 14, 2011

(30) Foreign Application Priority Data

Jan. 8, 2010   (KR) .................. 10-2010-0001660

(51) Int. Cl.
*H01L 21/44*    (2006.01)
(52) U.S. Cl.
USPC .......................... 438/598; 438/239; 438/639
(58) Field of Classification Search
USPC ........... 257/598, 639–640; 438/598, 639–640
See application file for complete search history.

(56) References Cited

U.S. PATENT DOCUMENTS

| | | | |
|---|---|---|---|
| 4,962,414 A * | 10/1990 | Liou et al. ................ 257/740 |
| 5,686,332 A * | 11/1997 | Hong ........................ 438/261 |
| 6,171,763 B1 * | 1/2001 | Wang et al. .............. 430/318 |
| 6,388,282 B1 * | 5/2002 | Hieda ....................... 257/300 |
| 2002/0008079 A1 * | 1/2002 | Chung ...................... 216/13 |
| 2006/0292867 A1 * | 12/2006 | Kim ........................ 438/667 |
| 2007/0145594 A1 * | 6/2007 | Park ........................ 257/763 |
| 2009/0057728 A1 * | 3/2009 | Boyle ...................... 257/273 |
| 2009/0130842 A1 * | 5/2009 | Hwang et al. ........... 438/637 |

FOREIGN PATENT DOCUMENTS

| | | |
|---|---|---|
| KR | 1020030058296 A | 7/2003 |
| KR | 1020050002362 A | 1/2005 |
| KR | 1020060074719 A | 7/2006 |
| KR | 1020060113264 A | 11/2006 |

* cited by examiner

*Primary Examiner* — Allen Parker (57) ABSTRACT

A method for forming a semiconductor device is disclosed. A method for forming a semiconductor device includes forming a first bit line contact over a semiconductor substrate, forming a second bit line contact that is coupled to the first bit line contact and has a larger width than the first bit line contact, and forming a bit line over the second bit line contact. When using the semiconductor device having a buried gate, although the bit line is formed to have a small width and the bit line pattern is misaligned, the method prevents incorrect coupling between a bit line and a bit line contact, so that it basically deteriorates unique characteristics of the semiconductor device.

16 Claims, 6 Drawing Sheets

METHOD FOR FABRICATING SEMICONDUCTOR DEVICE

CROSS-REFERENCE TO RELATED APPLICATION

The present application claims priority to Korean patent application number 10-2010-0001660, filed on 8 Jan. 2010, which is incorporated by reference in its entirety.

BACKGROUND OF THE INVENTION

Embodiments of the present invention relate to a method for forming a semiconductor device, and more particularly to a method for forming a bit line in a semiconductor device including a buried gate.

Among semiconductor memory devices, a dynamic random access memory (DRAM) device includes a plurality of unit cells each having a capacitor and a transistor. The capacitor is used to temporarily store data, and the transistor is used to transfer data between a bit line and the capacitor in response to a control signal applied through a word line. The data transfer occurs by using a semiconductor property where an electrical conductivity changes depending on environments. The transistor has three regions, i.e., a gate, a source, and a drain. Electric charges are moved between the source and the drain according to a control signal inputted to the gate of the transistor. The movement of the electric charges between the source and the drain is achieved through a channel region. The semiconductor property is used in the channel.

In a typical method for manufacturing a transistor, a gate is formed in a semiconductor substrate, and a source and a drain are formed by doping impurities into both sides of the gate. In this case, a channel region of the transistor is defined between the source and the drain under the gate. The transistor having a horizontal channel region occupies a predetermined area of a semiconductor substrate. With this conventional planar structure, it is difficult to reduce a unit cell area and enhance integrity.

If a unit cell area of the semiconductor memory device is reduced, the number of semiconductor memory devices per wafer is increased, thereby improving the productivity. Several methods for reducing the total area of the semiconductor memory device have been proposed. One method is to replace a conventional planar gate having a horizontal channel region with a recess gate in which a recess is formed in a substrate and a channel region is formed along a curved surface of the recess by forming a gate in the recess. Furthermore, a buried gate has been studied which can reduce a parasitic capacitance of a bit line by burying the entire gate within the recess.

BRIEF SUMMARY OF THE INVENTION

Various embodiments of the present invention are directed to providing a method for forming a semiconductor device that substantially obviates one or more problems due to limitations and disadvantages of the related art.

An object of the present invention is to provide a semiconductor device having a buried gate, which prevents the occurrence of poor contact between a bit line and a bit line contact during the patterning of a bit line, and also prevents resistance from being increased when patterning is performed to increase the width of a bit line. That is, the semiconductor device can solve the problems of the related art. The problems of the related art are as follows. According to the related art, if a bit line is reduced in width and a bit line is misaligned during the patterning of a bit line, a bit line contact coupled to the bottom of the bit line is exposed so that there arises poor contact between the bit line and the bit line contact. In addition, according to the related art, if the patterning is performed in such a manner that the width of bit line is increased, a coupling width of a storage electrode contact formed in a subsequent process becomes narrower, resulting in increased resistance.

In accordance with one aspect of the present invention, a method for forming a semiconductor device includes forming a first bit line contact over a semiconductor substrate, forming a second bit line contact over the first bit line contact that is coupled to the first bit line contact and has a width larger than the first bit line contact, and forming a bit line over the second bit line contact.

The forming of the first bit line contact may include forming an interlayer insulating film, forming a bit line contact trench in the interlayer insulating film, forming a spacer at sidewalls of the bit line contact trench, forming a first bit line contact conductive layer over the bit line contact trench, and etching the first bit line contact conductive layer in to form the first bit line contact buried between spacers.

The method may further include performing a planarization etching process on the first bit line contact conductive layer so as to expose the interlayer insulating film.

The etching of the first bit line contact conductive layer may be performed by dry-etching or wet-etching.

The etching of the bit first line contact conductive layer may include etching the first bit line contact conductive layer by a depth that is about half a depth of the bit line contact trench.

The method may further include removing a spacer exposed by the first bit line contact.

The removing of the spacer exposed by the first bit line contact may be performed by a wet etching or an isotropic dry etching process.

The method may further include performing wet cleaning at an upper part of the first bit line contact.

The forming of a second bit line contact may include forming the bit line contact conductive layer over the first bit line contact, and performing a planarization etching process or etch-back process on the second bit line contact conductive layer so as to expose the interlayer insulating film.

The forming of the bit line may includes forming a bit line electrode over the second bit line contact, forming a hard mask layer over the bit line electrode, and etching the hard mask layer and the bit line electrode.

The method may further include forming a barrier metal layer between the bit line and the second bit line contact.

The method may further include forming a spacer at sidewalls of the bit line.

The method may further include forming a buried gate buried in the semiconductor substrate.

The method may further include forming an interlayer insulating film over the semiconductor substrate, forming a bit line contact trench in the interlayer insulation film, forming a spacer over sidewalls of the bit line contact trench, forming a first bit line contact conductive layer filling in the bit line contact trench, etching the first bit line contact conductive layer in such a manner that the bit line contact trench is buried between the spacers.

In accordance with one aspect of the present invention, a semiconductor device includes a substrate, a bit line contact pattern formed over the substrate, the bit line contact pattern having a lower portion and an upper portion, a bit line formed over the bit line contact pattern and electrically coupled to the bit line contact, wherein the bit line contact pattern has a first width at the lower portion and a second width at the upper portion, the second width being larger than the first width.

The semiconductor device may further include a first spacer formed at a sidewall of the lower portion of the bit line contact, wherein the first spacer and the upper portion of the bit line are at least partially overlapped.

The semiconductor device may further include wherein the bit line contact pattern includes a first bit line pattern with the first width and a second bit line pattern formed over the first bit line pattern and having the second bit line width.

The semiconductor device may further include a first spacer formed at a sidewall of the first bit line contact, wherein the first spacer and the second bit line are at least partially overlapped.

In accordance with another aspect of the present invention, a method for forming a semiconductor device includes forming a bit line contact pattern over a substrate, the bit line contact pattern having a first portion and a second portion, forming a bit line over the bit line contact pattern, the bit line electrically coupling the bit line contact, wherein the bit line contact pattern has a first width at the first portion and a second width at the second portion, the second width being larger than the first width.

The method may further include wherein the spacer and the upper portion of the bit line are at least partially overlapped, wherein the first portion is provided below the second portion.

DESCRIPTION OF EMBODIMENT

Reference will now be made in detail to the embodiments of the present invention, examples of which are illustrated in the accompanying drawings. Wherever possible, the same reference numbers will be used throughout the drawings to refer to the same or like parts.

FIGS. 1A to 1J are cross-sectional views illustrating a method for forming a semiconductor device according to one embodiment of the present invention. FIGS. 1K to 1L are cross-sectional views illustrating a method for forming a semiconductor device according to another embodiment of the present invention.

Figure 1A:
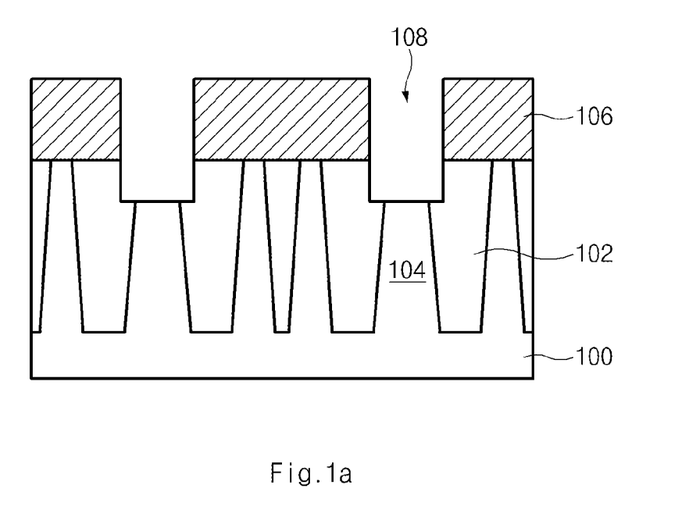
FIGS. 1A to 1J are cross-sectional views illustrating a method for forming a semiconductor device according to one embodiment of the present invention.

Referring to FIG. 1A, an interlayer insulating film 106 is formed over the semiconductor substrate 100 including an active region 104 defined by a device isolation film 102. Although not shown in FIG. 1A, it is preferable that the semiconductor substrate 100 includes a buried gate. Subsequently, the interlayer insulating film 106 is etched to expose the active region 104, so that a bit line contact hole 108 is formed.

Figure 1B:
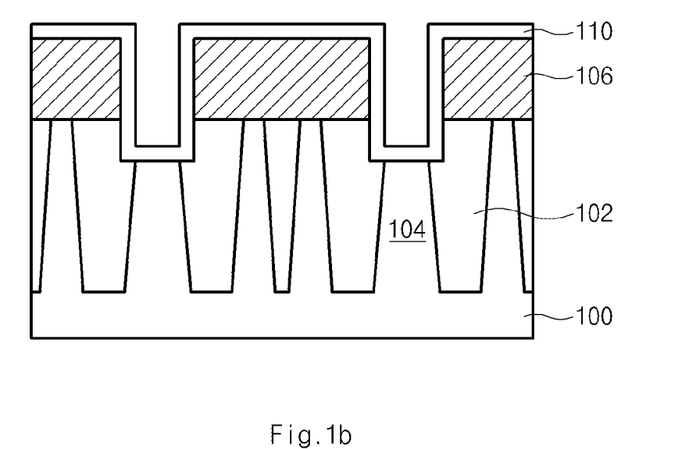
Figure 1C:
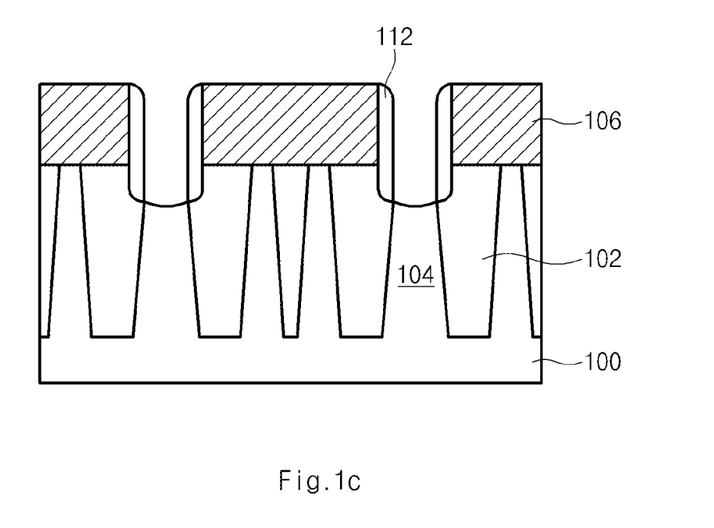

Referring to FIGS. 1B and 1C, a spacer insulation film 110 is formed over the entirety region including the bit line contact hole 108 (See FIG. 1B). Subsequently, the spacer insulation film 110 is etched back so that a spacer 112 is formed at sidewalls of the bit line contact hole 108 (See FIG. 1C).

Figure 1D:
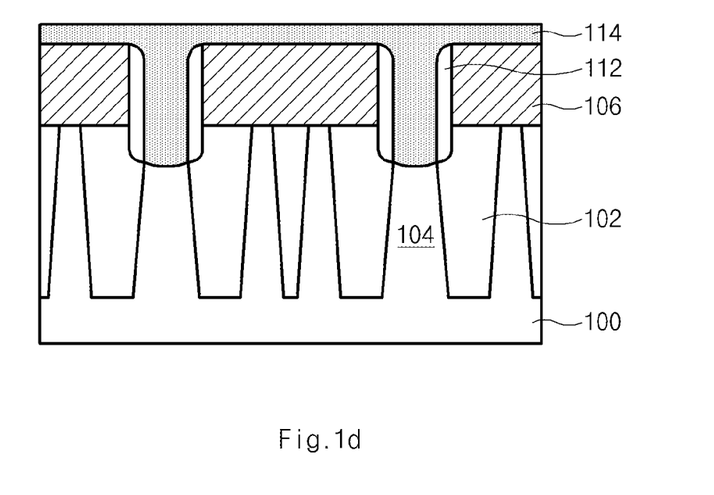
Figure 1E:
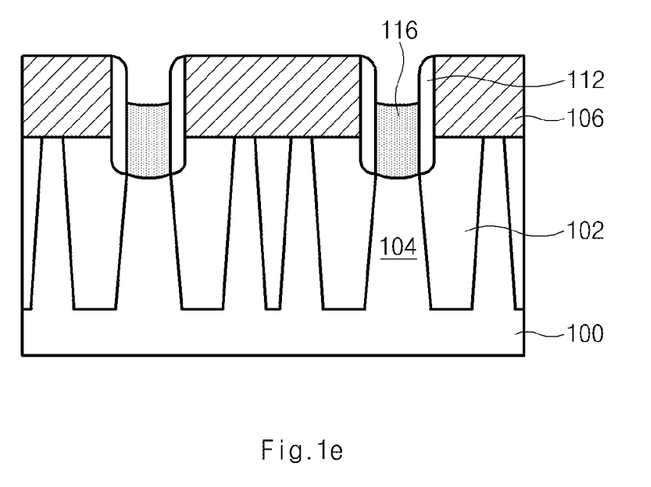

Referring to FIGS. 1D to 1E, a first conductive layer 114 for a bit line contact is formed over the entire region including the spacer 112 (See FIG. 1D). Subsequently, a planarization process is performed on the first conductive layer 114 to expose the interlayer insulating film 106, and the first conductive layer 114 for the bit line contact is etched, so that a first bit line contact 116 for partially burying a lower part of the contact hole 108 is formed (See FIG. 1E). The first conductive layer 114 for the bit line contact is etched by dry-etching process or wet-etching process. In this case, it is preferable that the height of the first bit line contact 116 be half the depth of the contact hole 108.

Figure 1F:
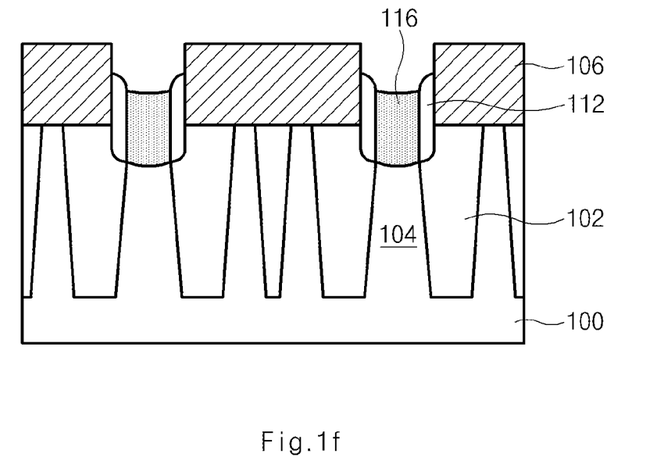
Figure 1G:
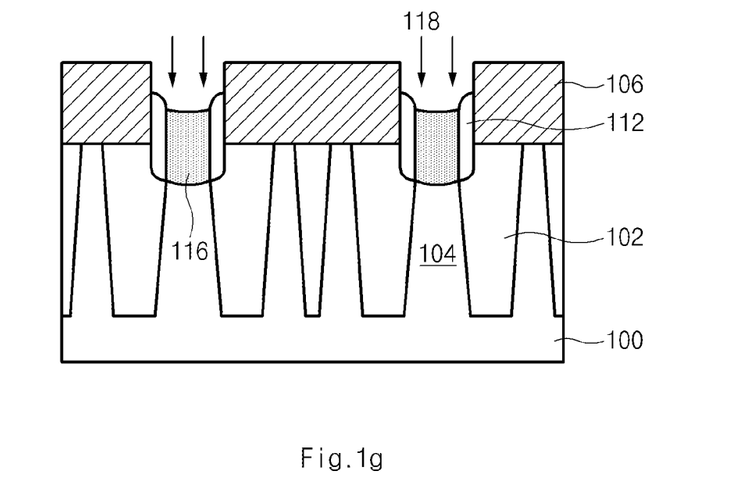

Referring to FIGS. 1F and 1G, the spacer 112 exposed by the first bit line contact 116 contained in the contact hole 108 is removed (See FIG. 1F). In this case, it is preferable that the spacer 112 be wet-etched or be removed by an isotropic dry etching method in such a manner that the spacer 112 can be selectively removed. Subsequently, a wet cleaning process 118 is performed to extend the bit line contact region (See FIG. 1G).

Figure 1H:
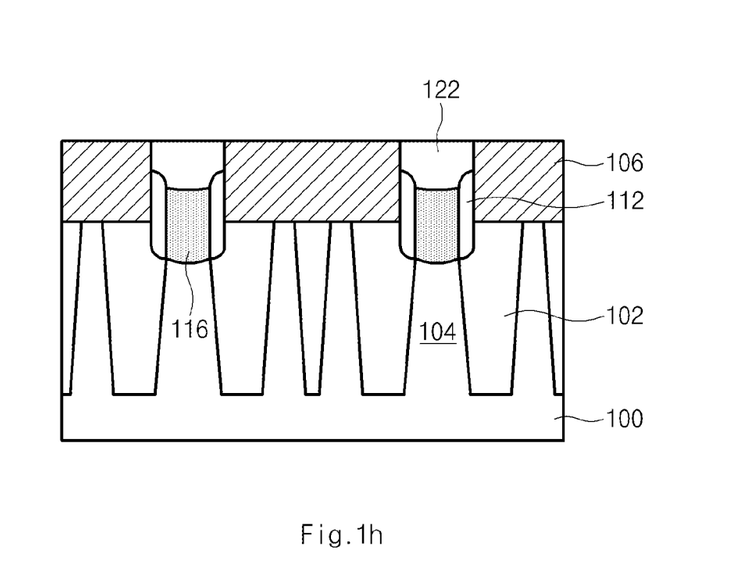

Referring to FIG. 1H, a second conductive layer for a bit line contact is formed over the entire region including the first bit line contact 116. A planarization etching process or an etch-back process is performed to form a second bit line contact 122. In this case, the second bit line contact 122 is formed to have a width larger than the first bit line contact 116 by the size of the region of the spacer 112 that was exposed and removed by the etching of the contact conductive layer 114 in a previous process. Accordingly, in a subsequent process, although the bit line is misaligned during a subsequent masking process, the loss of the first bit line contact 116 is prevented due to the presence of the spacers 112 at sidewalls. In more detail, one case in which the bit line patterning is performed in such a manner that the bit line is reduced in width will hereinafter be described with reference to FIGS. 1I and 1J, and another case in which the bit line is misaligned will hereinafter be described with reference to FIGS. 1K and 1L.

Figure 1I:
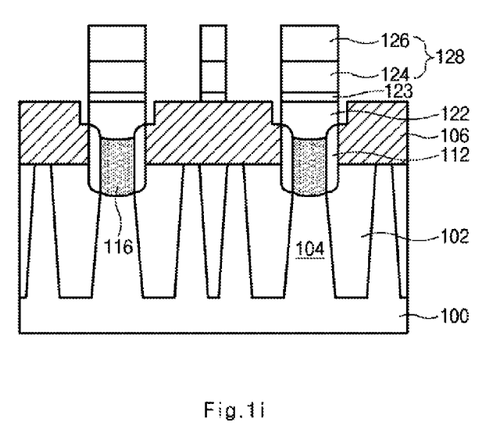

Referring to FIG. 1I, a bit line electrode 124 and a hard mask layer 126 are formed over the entire region including the second bit line contact 122. A photoresist pattern for defining a bit line is formed, and a hard mask layer 126 and a bit line electrode 124 are etched using the photoresist pattern as an etch mask, so that a bit line 128 is formed. In this case, a barrier metal layer may be further formed between the bit line electrode 124 and the second bit line contact 122. The second bit line contact 122 would be attacked during the patterning of the bit line 128, especially at sidewalls. However, the first bit line contact 116 can be protected by the attack owing to the spacer 112 at sidewalls. The size of a coupling region between the bit line and the bit line contact is not reduced, so that the embodiment of the present invention can prevent an increase in resistance between the bit line 128 and the bit line contacts 112 and 122.

Figure 1J:
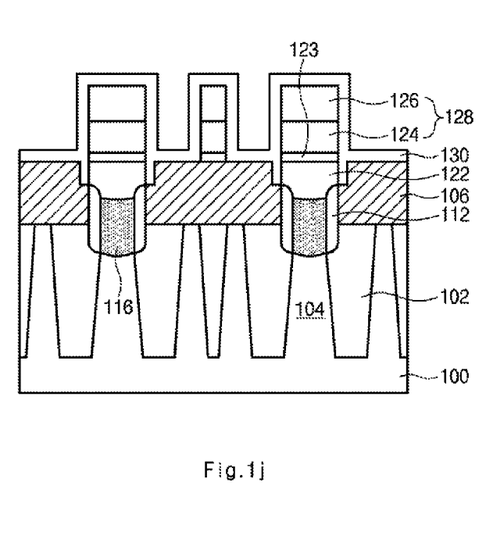
Figure 1K:
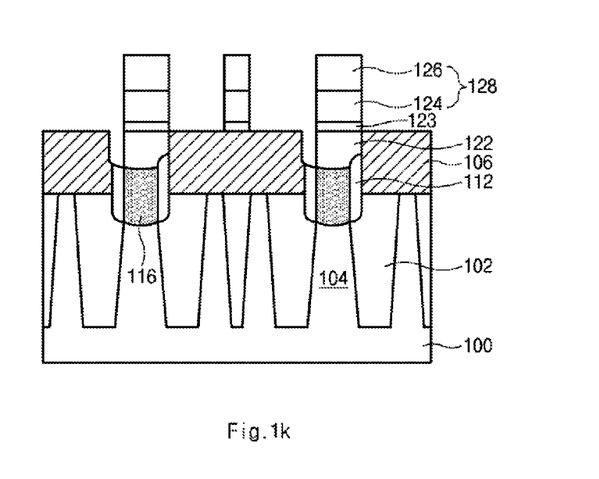
FIGS. 1K to 1L are cross-sectional views illustrating a method for forming a semiconductor device according to another embodiment of the present invention.
Figure 1L:
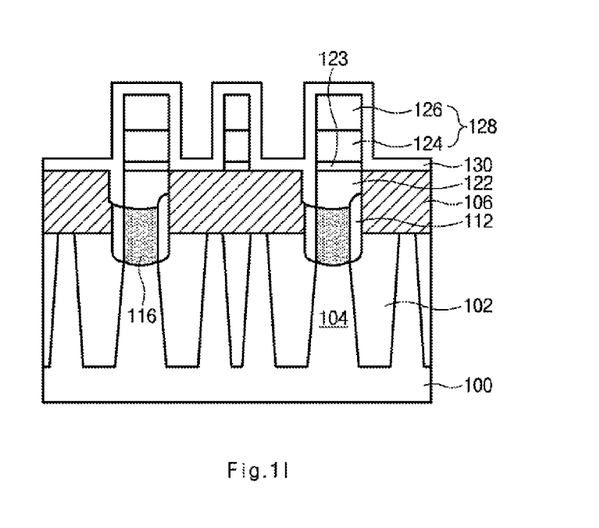

Referring to FIG. 1J, after an insulating film 130 for a spacer is formed over the entire region including the bit line 128, a spacer etching process is performed so that a spacer is formed at sidewalls of the bit line 128. In this case, the spacer insulating film 130 is also filling in a recess created in the second bit line contact 122 as a result that the second bit line contact 122 is attacked during the bit line patterning process. In this manner, the spacer insulating film 130 may also be used to form a spacer of the second bit line contact 122.

As described above, although the bit line contact including the first bit line contact 112 and the second bit line contact 122 is etched during the bit line patterning, each sidewall of the second bit line contact that has a larger width than the first bit line contact 116 can prevent the coupling region between the bit line 128 and the bit line contact 112 and 122 from being decreased.

Referring to FIG. 1K, after forming the conductive layer for a bit line contact, a planarization etching process and an etch-back process are performed so that a second bit line contact 122 is formed. Subsequently, the bit line electrode 124 and the hard mask layer 126 are formed, a photoresist pattern for defining a bit line is formed, and the hard mask layer 126 and the bit line electrode 124 are etched using the photoresist pattern as an etch mask, so that the bit line 128 is formed. In this case, a barrier metal layer may be further formed between the bit line electrode 124 and the second bit line contact 122. In this case, if an exposure mask for defining a bit line photoresist pattern is misaligned, the bit line photoresist pattern is formed misaligned to be shifted to one direction. When the bit line photoresist pattern is misaligned, the second bit line contact 122 might be attacked, especially at a sidewall. However, the first bit line contact 116 is protected by the attack owing to the spacers present at sidewalls. Accordingly, a coupling region between the bit line 128 and the bit line contact including the first and the second bit line contacts 112 and 122 is not reduced in size, so that the semiconductor device according to the present invention can prevent the related art problem causing increased resistance. Therefore, the embodiment of the present invention can solve the problems of the related art which deteriorates operation characteristics of a conventional semiconductor device due to poor coupling between the bit line and the bit line contact.

Referring to FIG. 1L, after an insulating film 130 for a spacer is formed over the entire structure including the bit line 128, the etch-back process is performed so that a spacer is formed at sidewalls of the bit line 128. In this case, it is preferable that the second bit line contact 122 partially etched by misalignment be buried by the spacer insulating film 130.

In this case, although the bit line contact is etched during the bit line patterning, only a particular sidewall of the second bit line contact 122 that has a width larger than the first bit line contact 116 is etched. A coupling region between the bit line and the bit line contact is not reduced in size, so that the semiconductor device deterioration caused by increased contact resistance is prevented.

As apparent from the above description, the method for forming the semiconductor device according to the embodiment of the present invention has the following effects. Although the bit line is formed to have a small width and the bit line pattern may be misaligned, in the case of using the semiconductor device that has a buried gate, the embodiment of the present invention prevents poor coupling between the bit line and the bit line contact, so that it can basically deteriorate unique characteristics of the semiconductor device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
   forming an interlayer insulating film;
   forming a bit line contact trench in the interlayer insulating film;
   forming a spacer at sidewalls of the bit line contact trench;
   forming a first bit line contact conductive layer over the bit line contact trench;
   etching the first bit line contact conductive layer to form a first bit line contact buried between the spacer;
   removing an exposed portion of the spacer after forming the first bit line contact;
   forming a second bit line contact over the first bit line contact that is coupled to the first bit line contact and has a width larger than the first bit line contact; and
   forming a bit line over the second bit line contact.

2. The method according to claim 1, further comprising:
   performing a planarization etching process on the first bit line contact conductive layer so as to expose the interlayer insulating film.

3. The method according to claim 1, wherein the etching of the first bit line contact conductive layer is performed by dry-etching or wet-etching.

4. The method according to claim 1, wherein the etching of the first bit line contact conductive layer includes etching the first bit line contact conductive layer by a depth that is about half a depth of the bit line contact trench.

5. The method according to claim 1,
   wherein removing the exposed portion of the spacer is performed by a wet etching or an isotropic dry etching process.

6. The method according to claim 1, the method further comprising:
   performing wet cleaning at an upper part of the first bit line contact.

7. The method according to claim 1, wherein the forming of the second bit line contact includes:
   forming a second bit line contact conductive layer over the first bit line contact; and
   performing a planarization etching process or an etch-back process on the second bit line contact conductive layer to expose the interlayer insulating film.

8. The method according to claim 1, wherein the forming of the bit line includes:
   forming a bit line electrode over the second bit line contact;
   forming a hard mask layer over the bit line electrode; and
   etching the hard mask layer and the bit line electrode.

9. The method according to claim 1, the method further comprising forming a barrier metal layer between the bit line and the second bit line contact.

10. The method according to claim 1, the method further comprising forming a spacer at sidewalls of the bit line.

11. The method according to claim 1, the method further comprising forming a buried gate buried in the semiconductor substrate.

12. The method according to claim 1, wherein the forming of the first bit line includes:
   forming an interlayer insulating film over the semiconductor substrate;
   forming a bit line contact trench in the interlayer insulation film;
   forming a spacer over sidewalls of the bit line contact trench;
   forming a first bit line contact conductive layer filling in the bit line contact trench; and
   etching the first bit line contact conductive layer in such a manner that the bit line contact trench is buried between the spacers.

13. The method of claim 1, wherein the portion of the spacer removed is exposed by the etching of the first bit line contact conductive layer to form the first bit line contact.

14. A method for forming a semiconductor device comprising:
   forming an interlayer insulating film over a substrate;

forming a trench in the interlayer insulating film, the trench exposing an active region defined in the substrate;

forming a spacer at a sidewall of the trench, the spacer including dielectric material and defining an opening within the trench;

providing a conductive layer over the trench, the conductive layer being provided within the opening defined by the spacer;

etching the conductive layer to form a first bit line contact, the first bit line contact exposing an upper portion of the spacer that is formed at the sidewall of the trench;

etching the upper portion of the spacer;

forming a second bit line contact within the trench and over the first bit line contact and the etched spacer, the second bit line contact having a width larger than the first bit line contact; and forming a bit line over the second bit line contact.

15. The method of claim 14, wherein the active region is exposed by the opening defined by the spacer, and wherein the conductive layer is provided over the active region and makes an electrical contact with the active region.

16. The method of claim 15, wherein the substrate includes silicon material, and the trench extends into the silicon material of the substrate, and wherein the spacer extends to a bottom of the trench and extends into the silicon material.

* * * * *